United States Patent
Sano et al.

(10) Patent No.: US 7,582,393 B2
(45) Date of Patent: Sep. 1, 2009

(54) TRANSFER MASK BLANK, TRANSFER MASK, AND TRANSFER METHOD USING THE TRANSFER MASK

(75) Inventors: Hisatake Sano, Tokyo (JP); Morihisa Hoga, Tokyo (JP); Yukio Iimura, Tokyo (JP); Yuki Aritsuka, Tokyo (JP); Masaaki Kurihara, Tokyo (JP); Hiroshi Nozue, Tokyo (JP); Akira Yoshida, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 679 days.

(21) Appl. No.: 10/535,165

(22) PCT Filed: Dec. 1, 2003

(86) PCT No.: PCT/JP03/15327

§ 371 (c)(1),
(2), (4) Date: Jun. 2, 2005

(87) PCT Pub. No.: WO2004/051370

PCT Pub. Date: Jun. 17, 2004

(65) Prior Publication Data

US 2006/0068298 A1    Mar. 30, 2006

(30) Foreign Application Priority Data

Dec. 3, 2002  (JP)  .............. 2002-350837

(51) Int. Cl.
G03F 1/00  (2006.01)
(52) U.S. Cl. ......................................... 430/5

(58) Field of Classification Search .............. 430/5; 428/428, 430
See application file for complete search history.

(56) References Cited

U.S. PATENT DOCUMENTS

| 3,742,230 | A | 6/1973 | Spears et al. ............ 378/35 |
| 3,873,824 | A | 3/1975 | Bean et al. ............ 250/505 |
| 5,700,603 | A * | 12/1997 | Lee ............................ 430/5 |
| 6,150,280 | A | 11/2000 | Yamashita ............ 438/707 |
| 6,319,636 | B1 * | 11/2001 | Ham ............................ 430/5 |
| 7,022,607 | B2 * | 4/2006 | Yoshizawa ............ 438/689 |

FOREIGN PATENT DOCUMENTS

EP  244496  11/1987

(Continued)

Primary Examiner—Stephen Rosasco
(74) Attorney, Agent, or Firm—patenttm.us

(57) ABSTRACT

It is an object of the present invention to effectively manufacture a charged-particle beam lithography mask, an X-ray lithography mask, or an extreme ultraviolet beam lithography mask by using, for example, an existing writer such as an electron beam writer for photomasks, while achieving improvement in processing accuracy of a mask pattern. A lithography mask (1) comprises a substrate (2) which has a lower surface provided substantially at the center thereof with an opening (3) and a self-supporting membrane (m) having a pattern region (4) substantially at the center of an upper surface of the substrate (2) corresponding to the opening (3). The self-supporting membrane (m) is provided with through-holes (h) of a mask pattern in it or an absorber or scatterer of a mask pattern on it, and the pattern region (4) and a peripheral region around the pattern region (5) are in one plane.

15 Claims, 9 Drawing Sheets

FOREIGN PATENT DOCUMENTS

| | | |
|---|---|---|
| JP | 53-49953 | 5/1978 |
| JP | 55-15256 | 2/1980 |
| JP | 2-98125 | 4/1990 |
| JP | 3-29313 | 2/1991 |
| JP | 5-275319 | 10/1993 |
| JP | 7-176473 | 7/1995 |
| JP | 8-22940 | 1/1996 |
| JP | 10-268506 | 9/1998 |

* cited by examiner

FIG. 3
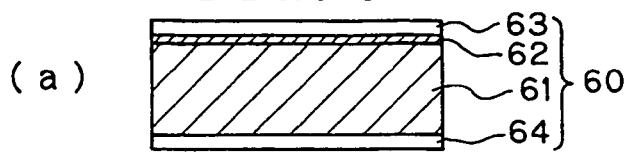
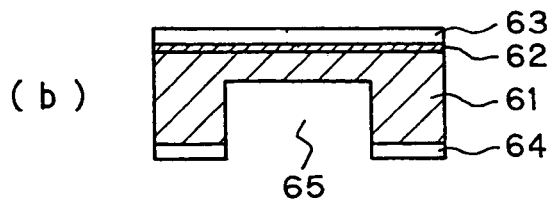
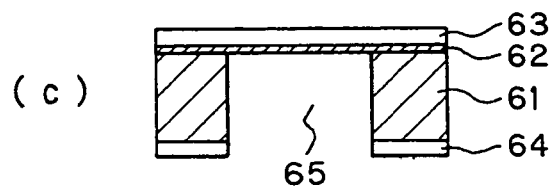
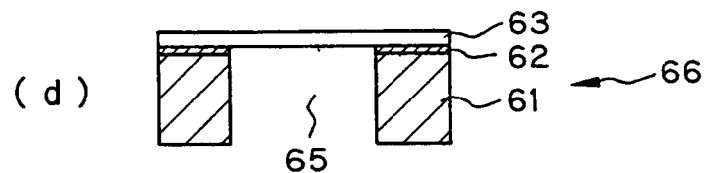
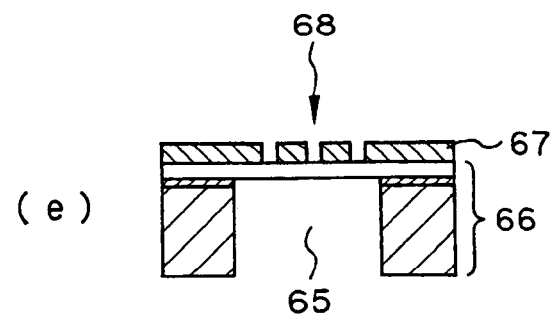
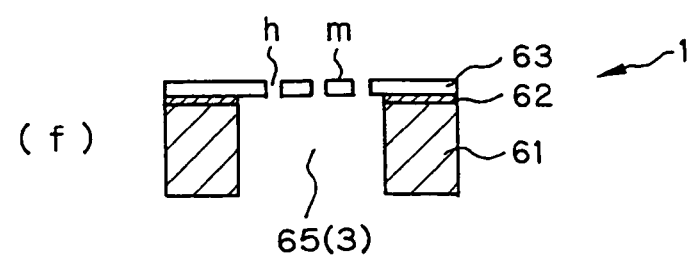

FIG. 5 PRIOR ART
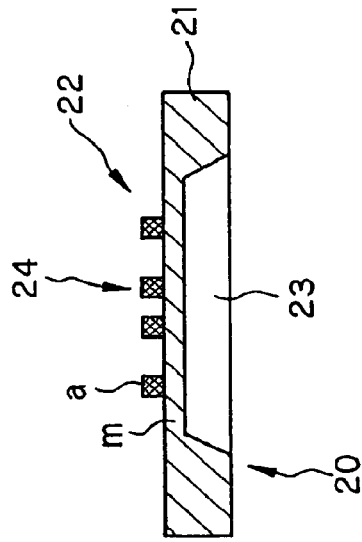
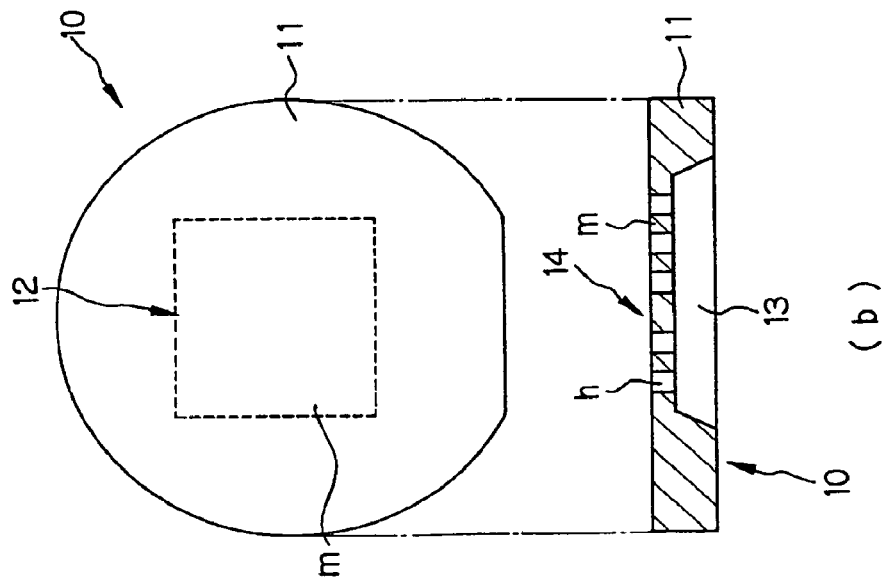

and a lithography using the lithography mask. More particularly, the present invention relates to a lithography mask and a lithography mask blank for proximity electron-beam projection lithography, a lithography using the lithography mask and further relates to a lithography mask blank for a lithography mask for other lithographies using charged-particle beams, X-ray, or extreme ultraviolet beam, and a lithography using the lithography mask.

TRANSFER MASK BLANK, TRANSFER MASK, AND TRANSFER METHOD USING THE TRANSFER MASK

TECHNICAL FIELD

The present invention relates to a lithography mask and a lithography mask blank to be used in the lithography process for manufacturing semiconductor integrated circuit devices and a lithography using the lithography mask. More particularly, the present invention relates to a lithography mask and a lithography mask blank for proximity electron-beam projection lithography, a lithography using the lithography mask and further relates to a lithography mask blank for a lithography mask for other lithographies using charged-particle beams, X-ray, or extreme ultraviolet beam, and a lithography using the lithography mask.

BACKGROUND ART

In the lithography process for manufacturing semiconductor integrated circuit devices, a pattern transfer by an optical reduction projection exposure with a photomask (sometimes, called reticle) is generally conducted. Electromagnetic waves used for the exposure are i-line (having a wavelength of 365 nm), KrF excimer laser light (having a wavelength of 248 nm), ArF excimer laser light (having a wavelength of 193 nm), or $F_2$ excimer laser light (having a wavelength of 157 nm), of which wavelengths are shortened for improving resolution. Since there are materials having very high transparency to such electromagnetic waves such as quartz (including fluorine-doped quartz), the structure of the photomask is ordinarily composed of a quartz substrate and a patterned absorber. That is, a photomask blank as a starting form for making a photomask is generally prepared by depositing an absorber on one surface of a quartz substrate. In this case, since the absorption coefficient of the quartz at the exposure beam as mentioned above is very small (i.e., the transparency is very high), there is little limitation on thickness of the substrate. Therefore, the shape of the photomask blank is defined in consideration for securing of required pattern region and rigidity of the mask. Currently, the shapes of photomask blanks are standardized, including a rectangular parallelepiped 6 inches, 7 inches, or 9 inches on a side, by SEMI (Non-patent document 1). The shape of the latest photomasks is now a square 6 inches in edge length and on a side and 0.25 inches in thickness.

On the other hand, as a pattern transfer method used in the lithography process for manufacturing semiconductor integrated circuit devices, there is a method in which a lithography mask (hereinafter, referred to simply as "mask") is irradiated with X-ray, extreme ultraviolet beam, or the charged-particle beams and a resist is exposed to the X-ray, the extreme ultraviolet beam, or the charged-particle beams which penetrate the mask with intensities determined by the mask pattern. As used herein, the X-ray means an electromagnetic wave having a wavelength on the order of 0.5 nm, the extreme ultraviolet beam means an electromagnetic wave having a wavelength of 13 nm, and the charged-particle beams mean electron beams or ion beams.

There is no material having high transparency relative to the X-ray, the extreme ultraviolet beam, or the charged-particle beams, just like quartz for electromagnetic waves used in photolithography. Therefore, the mask can have the so-called stencil membrane structure or continuous membrane structure for the X-ray, the extreme ultraviolet beam, or the charged-particle beams. The stencil membrane structure is a structure in which patterned through-holes "h" are formed in a self-supporting membrane "m" (hereinafter, referred to as "membrane") as shown in FIGS. 5(a) and 5(b). On the other hand, the continuous membrane structure is a structure in which a patterned absorber or scatterer "a" is formed on a membrane "m" as shown in FIG. 5(c).

As projection lithographies using electrons having high energy of 100 keV, there are the PREVAIL method (Non patent document 2) and SCALPEL method (Non patent document 3). The mask may have either of the stencil membrane structure and the continuous membrane structure. In the case of the continuous membrane structure, the mask has a patterned scatterer formed on a membrane. As for electron lithography masks for the PREVAIL method, a stencil membrane structure consisting of a silicon layer having a thickness of 2 μm has been reported. As for electron lithography masks for the SCALPEL method, a continuous membrane structure employing a 150-nm-thick silicon nitride (SiNx) layer as a membrane, and a complex layer comprising a 6-nm-thick chrome (Cr) layer and a 27-nm-thick tungsten (W) layer as a scatterer has been reported. In any of the electron projection lithographies, the mask is arranged to face a wafer coated with a resist on each side of a projection electron optical system and the transfer ratio is ¼.

In a low-energy electron-beam proximity projection lithography (Non patent document 4) using electrons of low energy of from 2 to 5 keV, a mask to be used has the stencil mask structure. As such a membrane, a silicon carbide (SiC) or silicon (Si) layer of from 0.3 to 0.5 μm in thickness has been reported. The mask is placed in proximity to a wafer with a resist applied thereon, facing the wafer. The distance between the mask and the wafer is from 50 to 40 μm.

In the lithography using extreme ultraviolet beam, a mask to be used generally is of reflective type, but a mask of transmissive type has been also reported. In this case, the mask structure may be either the stencil membrane structure or the continuous membrane structure.

In the proximity X-ray lithography, a mask to be used has the continuous membrane structure. For example, a mask employing a 2-μm-thick silicon nitride (SiNx) layer as the membrane and a 0.5-μm-thick tantalum (Ta) layer as the absorber has been reported. The mask is placed in proximity to a wafer with a resist applied thereon, facing the wafer. The distance between the mask and the wafer is from 20 to 5 μm.

In the proximity X-ray lithography and the low-energy electron-beam proximity projection lithography, the transfer ratio is 1. Therefore, one or several semiconductor integrated circuits to be transferred are disposed in a pattern region. If a large number of semiconductor integrated circuits are disposed, the number of semiconductor integrated circuits to be transferred at once is increased so as to increase the productivity, while a problem of deteriorating the positional accuracy of pattern is caused in case of a mask having a large area membrane. Therefore, the size of the pattern region is limited to a square 20-50 mm on a side. In the transfer at the wafer, a method of moving the transferring region successively in a step-and-repeat or step-and-scan mode is employed.

In terms of the mask structure, the mask for the proximity X-ray lithography (hereinafter, referred to as "proximity X-ray mask") and the mask for the low-energy electron-beam proximity projection lithography (hereinafter, referred to as "proximity electron-beam mask") have similar structures. Therefore, in the following description, these are collectively handled. When you heed that the absorber in the proximity X-ray mask and the scatterer of the proximity electron-beam mask correspond to each other, it is apparent that one structure can be easily employed as the other structure, except the pattern region.

Hereinafter, the structure of the conventional lithography mask will be shown in FIGS. 5(a)-5(c), FIGS. 6(a) and 6(b), and FIGS. 7(a) and 7(b), focusing on its shape. FIGS. 5(a) and 5(b) are a plan view (a) and a sectional view (b) of a proximity electron-beam mask, respectively. The shape of a mask 10 itself has the form of a silicon wafer because a silicon wafer is employed as a substrate 11. The substrate 11 is provided at its center 12 with a pattern region of square about 50 mm on a side over an opening 13 and is further provided with a perforated pattern 14 formed in the pattern region. The substrate 11 has a wafer shape of 4 inches to 8 inches. Actually, a proximity electron-beam mask with a substrate 11 having an outer diameter of 4 inches is manufactured. In the above description, the discussion whether the material of the perforated pattern 14 and the material of the substrate are the same or not is omitted because the above description is made only focusing on the shape.

FIG. 5(c) is a sectional view of a proximity X-ray mask 20 without a plan view. A substrate 21 has a wafer shape. The substrate 21 is provided at its center 22 with a pattern region over an opening 23 and is further provided with an absorber or scatterer pattern 24 fixed to the pattern region.

Shown in FIGS. 6(a) and 6(b) is a proximity X-ray mask 30. A substrate 31 has a wafer shape. Similarly to FIG. 5(c), the substrate 31 is provided at its center 32 with a pattern region over an opening 33 and is further provided with an absorber or scatterer pattern 34 fixed to the pattern region. The substrate 31 is fixed onto a frame 35 of which the outermost shape is a wafer shape similar to the substrate and which is provided with an opening 36 corresponding to the opening 33. According to the NIST standard, a mask comprising the substrate 31 having an outer diameter of 4 inches and the frame 35 having an outer diameter of 5 inches are established. A product example is shown in Non-patent document 5. A product example of a proximity electron-beam mask having a similar structure is reported in Non-patent document 6.

Shown in FIGS. 7(a) and 7(b) is another proximity X-ray mask 40. A substrate 41 has a wafer shape. The substrate 41 is provided at its center 42 with a pattern region over an opening 43 and is further provided with an absorber or scatterer pattern 44 fixed to the pattern region. The substrate 41 is fixed to a frame 45 which has a square shape and is provided with an opening 46 corresponding to the opening 43. Similarly, a low-energy electron-beam mask comprising a substrate having an outer diameter of 4 inches and a thickness of 0.525 mm, and a frame of a square about 6 inches on a side and a thickness of 5.82 mm (that is, the total thickness of the frame and the substrate is 0.25 inches) has been proposed.

Hereinafter, the term "substrate" is used to express a substrate itself (e.g., 31 in FIG. 6) or a substrate plus an absorber or scatterer (e.g., 31 plus 43 in FIG. 6) because the presence of the absorber or scatterer would not affect this invention. Thus it can be stated that the mask in FIG. 6 comprises the substrate and the frame.

It is apparent from the above examples that, as for the pattern region, a 4-inch wafer is satisfactorily employed as the mask substrate. In either the conventional example 2 shown in FIGS. 6(a) and 6(b) or the conventional example 3 shown in FIGS. 7(a), 7(b), the frame 35, 45 has a function of increasing the rigidity of the entire mask by fixing the mask substrate 31, 41 to the frame 35, 45 so as to prevent the mask substrate from deforming during manufacturing of the mask, thereby ensuring the positional accuracy of the pattern and facilitating the handling of the mask during transportation and in a transferring apparatus.

On the other hand, in the conventional example 1 shown in FIGS. 5(a)-5(c), a wafer of 8 inch size is employed as the substrate 11, 21. This is because, by employing a large wafer as the substrate 11, 21, a portion of the substrate other than the pattern region is adopted to have the same function as the frame has. Further, since the electron lithography mask for the PREVAIL has a wafer shape of 8 inch size, the same shape is employed for the proximity electron-beam mask and the electron lithography mask. Therefore, there is an advantage of promoting the common use of the manufacturing apparatus.

The relation between a proximity electron-beam mask or a proximity X-ray mask as described in the above and a mask blank (hereinafter, referred to as just "blank") before the mask is manufactured will be described. Normally, masks in commercial mass production are processed, starting with blanks as products in intermediate stage but not with substrates. A blank is subjected to resist patterning (for example, resist coating, electron beam writing, resist development/rinsing) and etching so as to form a structure of a perforated pattern (see FIG. 5(b)) or an absorber or scatterer pattern (see FIG. 5(c)). The scope of the present invention as will be described later also covers cases in which a similar mask structure is produced even when manufacturing processes are out of the aforementioned sequence, for example, the process does not start with the blank. Therefore, the structure of a mask is defined by the structure of a blank. The structure of blanks will be discussed below.

[Patent document 1]
Japanese Patent Unexamined Publication 2002-299229
[Patent document 2]
Japanese Patent Unexamined Publication H08-306614
[Non-patent document 1]
SEMI P1-1101: Specification for Hard Surface Photomask Substrates
[Non-patent document 2]
H. C. Pfeiffer, Journal of Vacuum Science and Technology B17 p. 2840 (1999)
[Non-patent document 3]
L. R. Herriott, Journal of Vacuum Science and Technology B15 p. 2130 (1997)
[Non-patent document 4]
T. Utsumi, Journal of Vacuum science and Technology B17 p. 2897 (1999)
[Non-patent document 5]
Y. Tanaka et al., Proceeding of SPIE 4409 p. 664 (2001)
[Non-patent document 6]
K. Kurihara et al., Proceeding of SPIE 4409 p. 727 (2001)

The conventional example 1 shown in FIGS. 5(a)-5(c) and the conventional example 2 shown in FIGS. 6(a)-6(b) have a disadvantage that a photomask manufacturing apparatus is hardly employed in processes for manufacturing a mask, such as an electron beam writing process, a dry-etching process, a particle-detecting process, a defect-detecting process, and a pattern-size-measuring process by a scanning electron microscope. If the photomask manufacturing apparatus can be employed, it confers tremendous technical benefits and economical effects. A great benefit is received particularly in the electron beam writing process.

Since the pattern on the photomask is written by an electron beam writer, the writer for photomasks is specialized for photomasks so that the writer for photomasks can not write high-accuracy pattern to a substrate not having a photomask shape.

There are two types of systems for fixing a blank in the writing chamber of an electron beam writer, one of which is a cassette system and the other of which is a cassette-less system.

The cassette system is a system in which a photomask blank or a wafer-shaped blank is set to a special carrier called a cassette (sometimes called a pallet), the cassette with the blank set to it is entered into the writing chamber, and the writing is conducted in a state that the blank is fixed to the cassette.

On the other hand, the cassette-less system is a system in which a photomask blank is directly entered into the writing chamber and is fixed by a fixing mechanism on the table, that is, a system without using a cassette.

The cassette system has been employed in most of conventional electron beam writers, but now the kind of electron beam writers of the cassette type is decreased and the trend of technology directs to the cassette-less type. The reason is that the cassette-less type provides easier control of the temperature of photomasks and easily provides stable and high positional accuracy of pattern because the deformation of the photomask blank fixed to the fixing mechanism is unambiguous without being affected by the used cassette.

As a blank of a type on which pattern can be written by an electron beam writer designed and made exclusively for photomasks, the structure of the conventional example 3 shown in FIGS. 7(a), 7(b) has been proposed. However, if one attempts to use the electron beam writer for photomasks to the blank of this example, one will find a problem that it is hard to keep the surface to be patterned (hereinafter, referred to as a pattern region surface) in a focusing range of electron beams. This point will now be described in detail.

Hereinafter, an example of a cassette-less-type writer will be explained. FIGS. 8(a) and 8(b) are a plan view (a) and a side view (b) schematically showing a preparation arrangement for writing onto a conventional photomask blank 50. The photomask blank 50 placed at a fixed position on the table within the writing chamber of an electron beam writer for photomasks is arranged as shown in FIGS. 8(a) and 8(b). It should be noted that the upper surface of the photomask blank 50 is covered with an electron beam resist, but not shown.

In this example, the photomask blank 50 is pressed against hemispheroids 52, which are made of ruby or the like and fixed on the lower surfaces of end portions of three fixing arms 51 in the electron beam writer for photomasks, by lifting mechanisms 53 from the bottom. An area defined by the tips (hereinafter, referred to as "reference points A") of the three hemispheroids 52 is a reference surface for defining the upper surface position of the photomask blank 50 for writing. The positions of the three reference points A depend on the manufacturers of the electron beam writer for photomasks. Normally, the positions are at a distance of from 5 to 10 mm from the outer periphery of the substrate of the photomask blank 50. When the pattern region of the photomask blank 50 is irradiated with electron beams by using the electron beam writer for photomasks, the focusing surface of electron beams is normally adjusted relative to the aforementioned reference surface. If the pattern region surface (the upper surface coated with the electron beam resist) of the photomask blank 50 shifts largely from the electron beam focusing surface, it causes deterioration of a resist pattern image. The allowable shift in practical use depends on the required resolution of subject pattern, but generally from 10 to 30 μm.

In the case of using a cassette, the cassette is provided with a mechanism for fixing a photomask blank 50 and defining a reference surface similarly to that shown in FIGS. 8(a) and 8(b). Therefore, in the cassette-type writer, the focusing surface of electron beams, when the cassette is loaded in the writing chamber, is aligned to the aforementioned reference surface.

As mentioned above, the reference surface in the writing chamber of the electron beam writer for photomasks is set in one plane as the pattern region surface of the photomask blank 50. For more details, the photomask blank 50 supported by three points on the outer periphery may be curved spherically at its center by its own weight. The degree of the deflection of the pattern region surface can be estimated theoretically. Accordingly, the influence on positional accuracy of pattern can be reduced to a negligible degree by correction during writing.

In a height measurement conducted before the writing with this arrangement, as shown in FIG. 8(b), the height of the pattern region surface is measured at several points. FIG. 8(b) shows a system in which two laser beams 541, 542 are incident on and thus reflected by the pattern region surface and the reflected beams are caught by two CCD line sensors (not shown). In one setting example, when the height of the pattern region surface from the reference surface measured by this measurement system exceeds a specified value (for example, 20 μm), the writing is cancelled.

FIG. 9 is a schematic drawing showing a case of writing preparation in which a blank 40' for a mask 40 of the conventional example 3 shown in FIGS. 7(a) and 7(b) is fixed to the table in the writing chamber of the electron beam writer for photomasks. It should be noted that the upper surface of the blank 40' is covered with an electron beam resist, but not shown. The reference surface defined by the three reference points A and the pattern region surface of the blank 40' is away from each other by the thickness d of a substrate 41 (in some cases, including the thickness of an adhesive layer, i.e., normally from 0.4 to 0.6 mm).

Another example of the cassette structure different from the above example in a cassette-type writer will be explained. Instead of the three sets of fixing arms, hemispheroids, and lifting mechanism in the example of FIGS. 8(a) and 8(b), the cassette of this example has three sets on the left side and three sets on the right side, i.e., six sets in total of fixing arms, hemispheroids, and lifting mechanisms. These are positioned at a distance of from 5 to 10 mm from the outer periphery. The substrate of the photomask blank 50 fixed to the cassette may be curved into a cylindrical shape by its own weight. The degree of the deflection of the pattern region surface can be estimated theoretically. Accordingly, the influence on positional accuracy of pattern can be reduced to a negligible degree by correction during writing. It should be noted that the reference surface of this example is not unique and is a curved surface tangent to the tips of the six left and right hemispheroids. The discussion about the aforementioned example is applicable to this example too.

In the normal arrangement for writing on a photomask blank, the focusing surface of electron beams is aligned relative to the reference surface as mentioned above. In the conventional example 3 shown in FIGS. 7(a) and 7(b), writing is conducted after aligning the focusing surface of electron beams relative to the blank 40' for the mask 40 according to information of the height of the pattern region surface. If the focusing surface of electron beams is apart from the reference surface by 0.3 mm or more, a problem of not obtaining high positional accuracy is caused. In the form that the substrate 41 and the frame 45 are fixed to each other, it is difficult to keep the upper surface of the substrate 41 parallel to the upper surface of the frame 45. Accordingly, there may be a problem that the height of the pattern region surface shifts largely from the focusing area of electron beams due to the inclination of the upper surface of the substrate 41.

In the electron beam writer for photomasks, a positioning mechanism is employed on the presupposition that the shape of a substrate of a photomask blank is rectangular. That is, the photomask blank is positioned such that the outer sides of the photomask blank are parallel to the x-y coordinate axes of the table and is then fixed. However, in the case of writing to blanks for masks 10, 20, 30 having a round shape as shown in FIGS. 5(*a*) and 6(*a*), the positioning mechanism equipped in the electron beam writer for photomasks is useless. Consequently, there is a problem that it is not possible to accurately write a mask pattern on the pattern region at the center of the blank.

DISCLOSURE OF THE INVENTION

The present invention is made in order to solve the above described problems. It is an object of the present invention to provide a lithography mask blank which allows a charged-particle beam lithography mask such as electron beams, an X-ray lithography mask, an extreme ultraviolet beam lithography mask to be effectively manufactured by using an existing writer such as an electron beam writer for photomasks and with improved processing accuracy of mask pattern, and to provide a lithography mask manufactured from such a lithography mask blank. It is another object of the present invention to provide a lithography using such a lithography mask.

A lithography mask blank of the present invention which can achieve the above described object comprises a substrate, having a shape of a substantially rectangular parallelepiped, of which the upper surface has a pattern region substantially at the center thereof and a peripheral region, and is characterized in that the pattern region and the peripheral region are in one plane.

Another lithography mask blank of the present invention comprises a substrate, having a shape of a substantially rectangular parallelepiped, which has the lower surface provided substantially at the center thereof with an opening and a self-supporting membrane having a pattern region substantially at the center of an upper surface thereof corresponding to said opening, wherein the pattern region and a peripheral region around the pattern region are in one plane.

The entire lithography mask blank may be integrally formed or, alternatively, the lithography mask blank may consist of said substrate and a frame having a shape of substantially rectangular parallelepiped, which are fixed to each other.

In the latter case, it is preferable that the fixing positions of the substrate with the frame substantially correspond to the reference points of a mechanism for fixing the transfer blank in a pattern writer or a cassette for housing the lithography mask blank.

The aforementioned lithography mask blank is preferably a blank for a charged-particle beam lithography mask or a blank for an X-ray or extreme ultraviolet beam lithography mask.

A lithography mask of the present invention comprises a substrate, having a shape of a substantially rectangular parallelepiped, which has a lower surface provided substantially at the center thereof with an opening and a self-supporting membrane having a pattern region substantially at the center of the upper surface thereof corresponding to the opening, and is characterized in that the self-supporting membrane is provided with through-holes of a mask pattern in it or an absorber or scatterer of a mask pattern on it, and the pattern region and a peripheral region around the pattern region are in one plane.

In this case, the entire lithography mask may be integrally formed or, alternatively, the lithography mask may consist of the substrate and a frame having a shape of a substantially rectangular parallelepiped, which are fixed to each other.

The aforementioned lithography mask is preferably used as a charged-particle beam lithography mask or as an X-ray or extreme ultraviolet beam lithography mask.

A lithography of the present invention is characterized in that a mask pattern is transferred by using charged-particle beams, X-ray, or extreme ultraviolet beam with a lithography mask comprising a substrate, having a shape of a substantially rectangular parallelepiped, which has a lower surface provided substantially at the center thereof with an opening and a self-supporting membrane having a pattern region substantially at the center of an upper surface thereof corresponding to the opening, wherein the self-supporting membrane is provided with through-holes of the mask pattern in it or an absorber or scatterer of the mask pattern on it, and the pattern region and a peripheral region around the pattern region are in one plane.

In the present invention, since the shape of the substrate is a substantially rectangular parallelepiped and the pattern region at substantially the center and the peripheral region of the upper surface of the substrate are in one plane, a charged-particle beam lithography mask, an X-ray lithography mask, or an extreme ultraviolet beam lithography mask having a fine pattern can be effectively and accurately manufactured by using, for example, an existing electron beam writer for photomasks. Therefore, it is possible to easily transfer an accurate and fine pattern from such a lithography mask to a resist.

BRIEF DESCRIPTION OF THE DRAWINGS

FIGS. 3(*a*)-3(*f*) are illustrations showing a process for manufacturing the lithography mask of the embodiment shown in FIGS. 1(*a*) and 1(*b*), including a process for manufacturing a mask blank and a process for manufacturing a mask for the lithography mask;

FIGS. 5(*a*)-5(*c*) are a plan view (a) and a sectional view (b) of a lithography mask of a conventional example 1 and a sectional view (c) of a variation thereof;

BEST MODES FOR CARRYING OUT THE INVENTION

Hereinafter, a lithography mask of the present invention and a lithography mask blank for manufacturing the same will be described with reference to embodiments.

Figure 1:
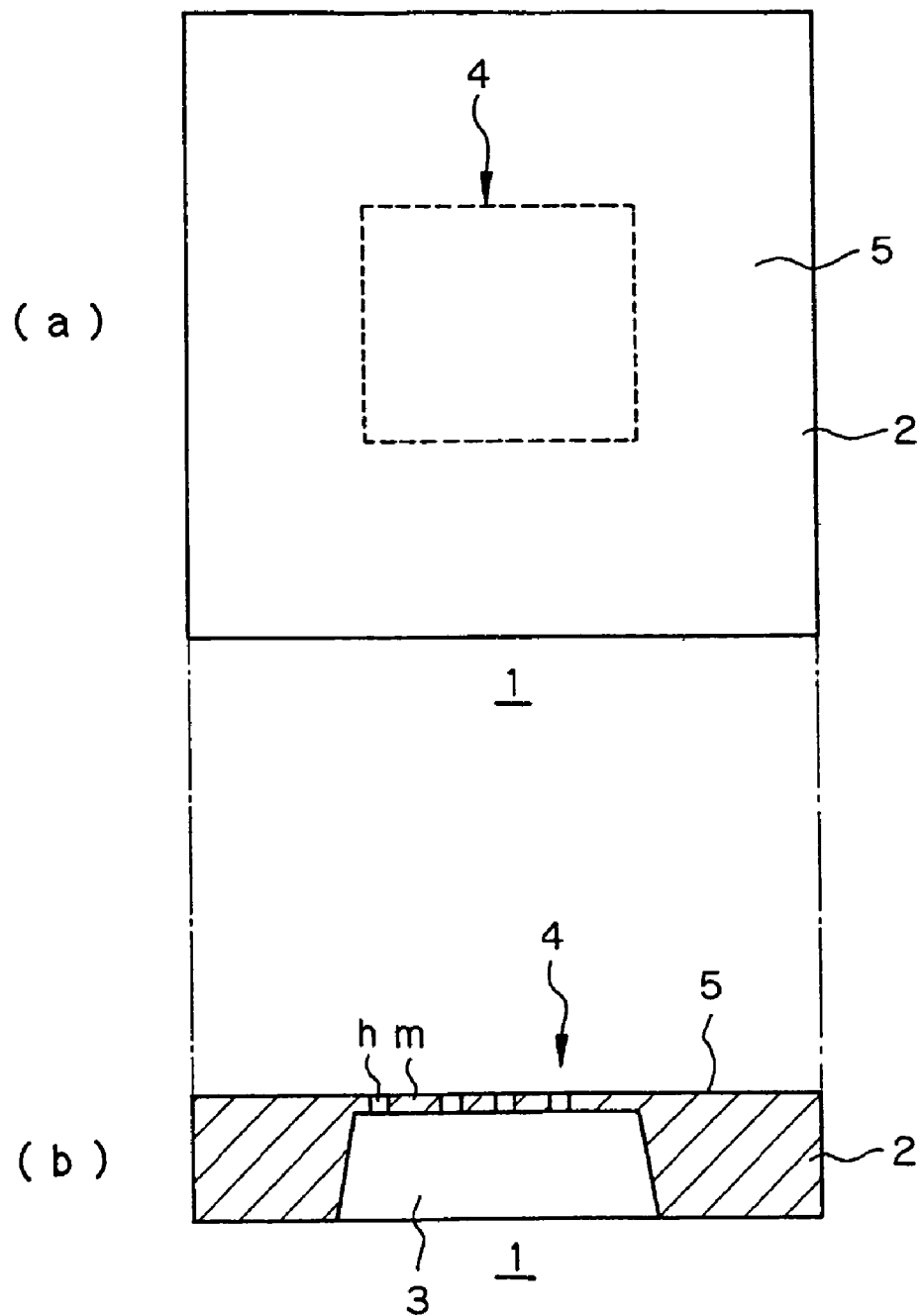
FIGS. 1(*a*) and 1(*b*) are a plan view (a) and a sectional view (b) of an embodiment of a stencil-type lithography mask according to the present invention.

FIGS. 1(a) and 1(b) are a plan view (a) and a sectional view (b) of an embodiment of a stencil-type lithography mask according to the present invention. The mask 1 comprises a substrate 2 which is provided with a pattern region 4 over an opening 3 formed in the center thereof. The pattern region 4 lies on a self-supporting membrane "m" in which patterned holes "h" are formed. A peripheral region 5, which is a part of the upper surface of the substrate 2, is arranged around the outer periphery of the pattern region 4. The shape of the mask 1 is a substantially rectangular parallelepiped which is formed as a unit such that the pattern region 4 and the peripheral region 5 are in one plane. The stencil-type lithography mask 1 is used as a lithography mask for X-ray or charged-particle beams.

A lithography mask blank used for a lithography mask 1 of this embodiment will be described with reference to product examples of the lithography mask 1 of this embodiment.

FIGS. 3(a)-3(d) show a process for manufacturing a blank and FIGS. 3(e)-3(f) show a process for manufacturing a mask using the blank. As shown in FIG. 3(a), a single crystal silicon which has a shape of a rectangular parallelepiped of 6 inches in length, 6 inches in width, and 0.25 inches in thickness is employed as a base material 61. Formed on one surface (a surface which will include a pattern region, and hereinafter referred to as a front surface) of the single crystal silicon is a silicon oxide layer of 0.4 μm in thickness as an etch-stop layer 62. Formed on the silicon oxide layer is a single crystal silicon layer 63 of 0.4 μm in thickness as a stencil layer. Formed on a surface opposite to the front surface (hereinafter, referred to as a back surface) is a silicon oxide layer 64 of 0.6 μm in thickness. In this manner, a substrate 60 is prepared. Such a substrate 60 is called a Silicon-On-Insulator (SOI) substrate and is made by a bonding method or a Separation-by-Implanted-Oxygen (SIMOX method). The internal stress of the silicon layer 63 on the front surface is preferably adjusted to have a tensile stress of 5 MPa or less by, for example, a boron doping method. All of the corners of the substrate 60 are suitably chamfered and rounded.

By using the substrate 60 as mentioned above, as shown in FIG. 3(b), a portion corresponding to an opening 3 (hereinafter, referred to a window 65) is removed from the back surface side by a discharge processing method (Patent document 1) or ultrasonic grinding method until the remaining thickness becomes about 60 μm. Though only one window is shown in FIG. 3(b), a plurality of windows may be formed.

Then, as shown in FIG. 3(c), silicon of the base material 61 remaining on the bottom of the window 65 is removed from the back surface side. During this, the silicon oxide layer 62 on the front surface side works as an etch-stop layer. As a method of removing silicon of the base material 61 remaining on the bottom of the window 65, anisotropic wet etching or dry etching in which the silicon oxide layer 64 on the back surface is used as a mask may be employed. The anisotropic wet etching is achieved by using an aqueous solution of potassium hydroxide at 90° C. and the dry etching is achieved by a Bosch method in which an etching step using a sulfur hexafluoride ($SF_6$) gas and a side wall protection step using an octafluorocyclobutane ($C_4F_8$) gas are repeated alternately.

Finally, as shown in FIG. 3(d), the silicon oxide layer 62 as the etch-stop layer and the silicon oxide layer 64 on the back surface are removed from the side of the back surface of the substrate 60 by using buffered hydrofluoric acid (a mixture solution of hydrofluoric acid and ammonium fluoride). This form is a lithography mask blank 66. It should be noted that the form in the step of FIG. 3(c) (with the silicon oxide layers 62, 64 remaining) may be used as a lithography mask blank.

Figure 8:
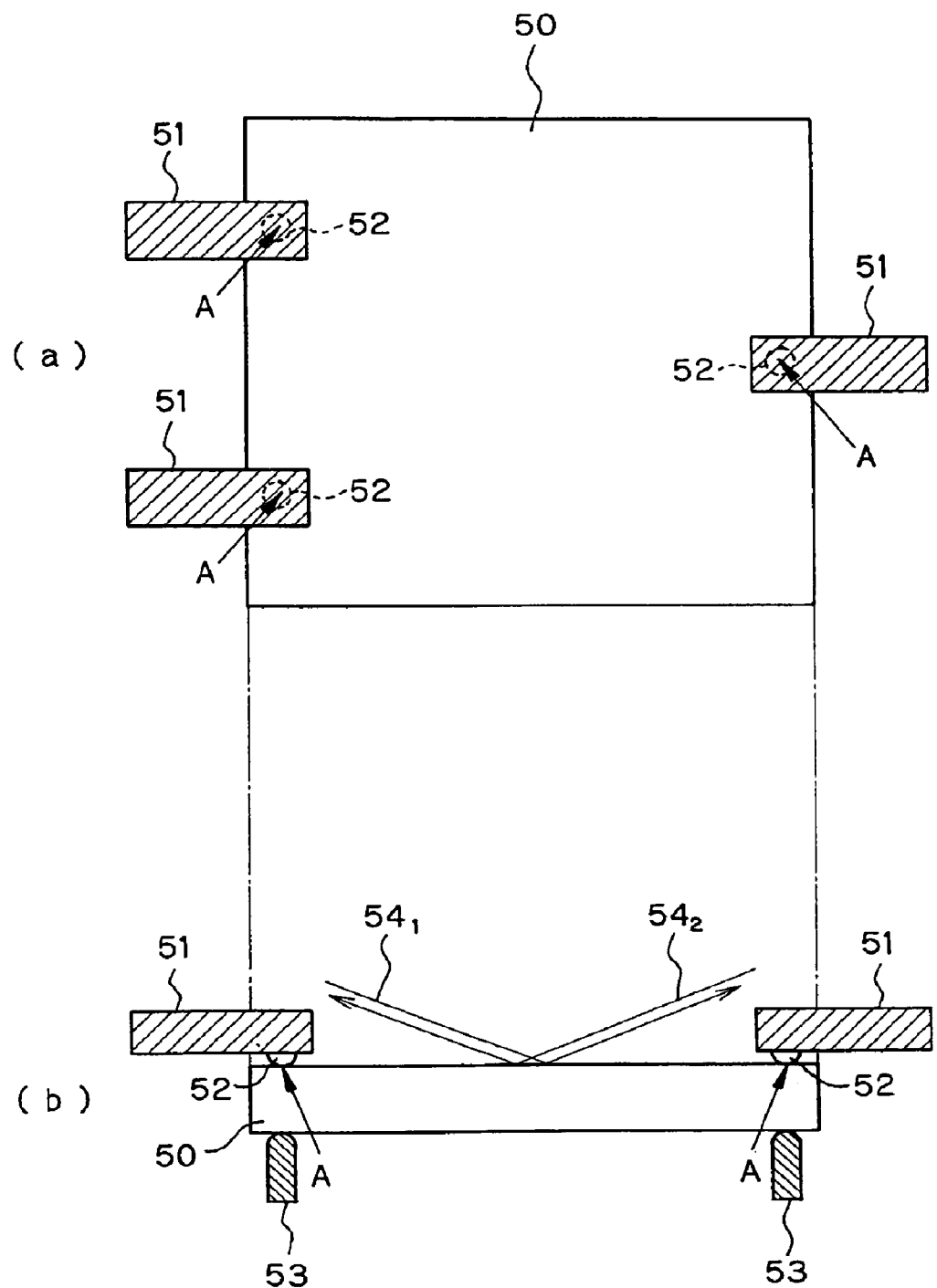
FIGS. 8(*a*) and 8(*b*) are a plan view (a) and a side view (b) schematically showing a fixing method and height measuring method for a photomask blank.
Figure 9:
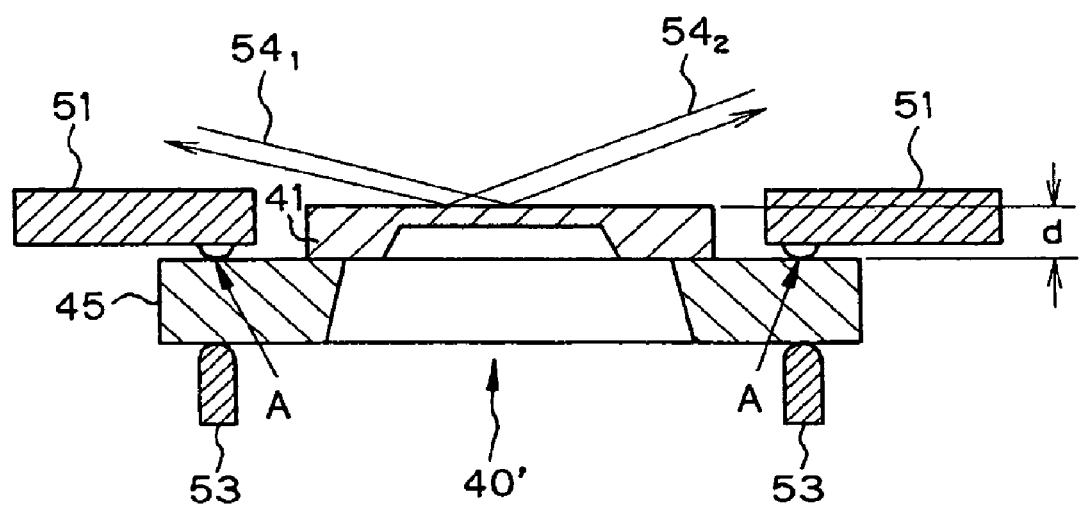
FIG. 9 is a schematic drawing showing a case of writing preparation in which a blank for a lithography mask of the conventional example 3 shown in FIGS. 7(*a*) and 7(*b*) is fixed to the table in the writing chamber of an electron beam writer for photomasks.

FIGS. 3(e)-3(f) show a process for manufacturing a mask using the blank 66. First, as shown in FIG. 3(e), resist is applied to the front surface of the blank 66 by a spin-coating method so as to form a resist layer 67. Then, the electron beam writer for photomasks is used and, instead of the photomask blank 50 shown in FIGS. 8(a), 8(b), the blank 66 having the resist layer 67 formed on the front surface thereof is disposed on the table of the writing chamber. As shown in FIGS. 8(a), 8(b), the blank 66 is pressed against the hemispheroids 52, which are fixed on the lower surfaces of end portions of the three fixing arms 51 in the writing chamber, by the lifting mechanisms 53 from the bottom so as to make a reference surface defined by the tips of the three hemispheroids 52 to agree with the surface of the resist layer 67. Since the shape of the blank 66 is a substantially rectangular parallelepiped similarly to the photomask blank 50, the blank 66 can be accurately positioned such that the outer sides of the blank are parallel to the x-y coordinate axes by using a positioning mechanism arranged in the writing chamber of the electron beam writer for photomasks. Therefore, the electron beams for writing are accurately focused on the resist layer 67 in the pattern region in the window 65 of the blank 66 and thus land on the accurate position, thereby enabling the writing of an accurate and fine pattern.

After the writing of the mask pattern, a resist pattern 68 is formed in the resist layer 67 over the window 65 through development of the exposed resist layer 67 and rinsing. Finally, as shown in FIG. 3(f), through-holes "h" are formed in the silicon layer 63 composing a membrane "m" on the front surface by dry etching using the resist pattern 68 as a mask and the resist pattern 68 is removed, thereby completing a stencil-type lithography mask 1 for X-ray or charged-particle beams.

Figure 2:
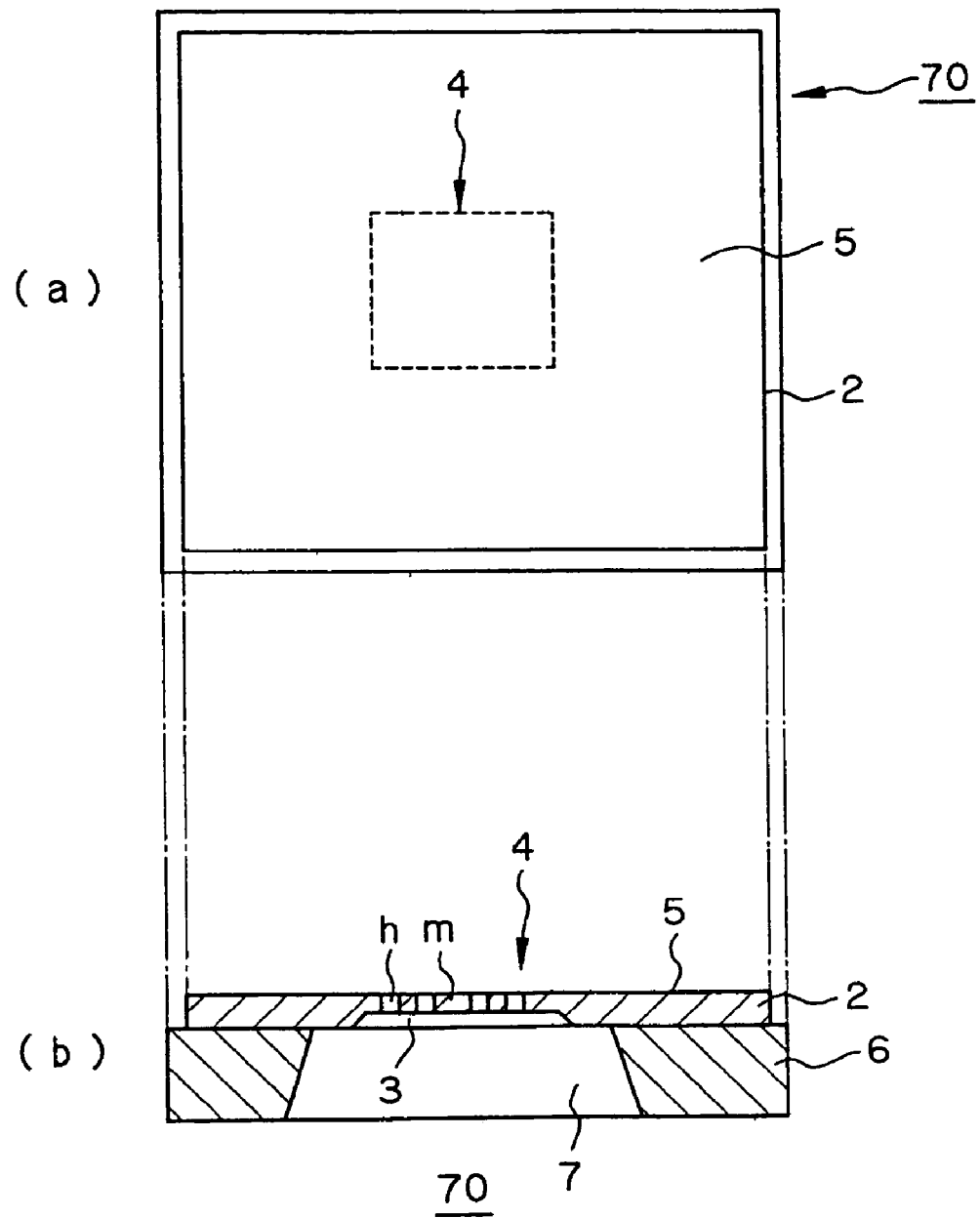
FIGS. 2(*a*) and 2(*b*) are a plan view (a) and a sectional view (b) of another embodiment of a stencil-type lithography mask according to the present invention.

FIGS. 2(a) and 2(b) are a plan view (a) and a sectional view (b) of another embodiment of a stencil-type lithography mask according to the present invention. This mask 70 comprises a substrate 2 provided with a pattern region 4 over an opening 3 at the center thereof, and a frame 6 provided with an opening 7 corresponding to the opening 3 of the substrate 2, wherein the frame 6 is fixed to the back surface of the substrate 2. The pattern region 4 lies on a self-supporting membrane "m" in which through patterned holes "h" are formed. Arranged around the periphery of the pattern region 4 is a peripheral region 5 which is a part of the upper surface of the substrate 2.

In this case, the shape of the mask 70 is a substantially rectangular parallelepiped and is adapted such that the pattern region 4 and the peripheral region 5 are in one plane. The stencil-type lithography mask 70 can be used as a lithography mask for X-ray or charged-particle beams.

Figure 4:
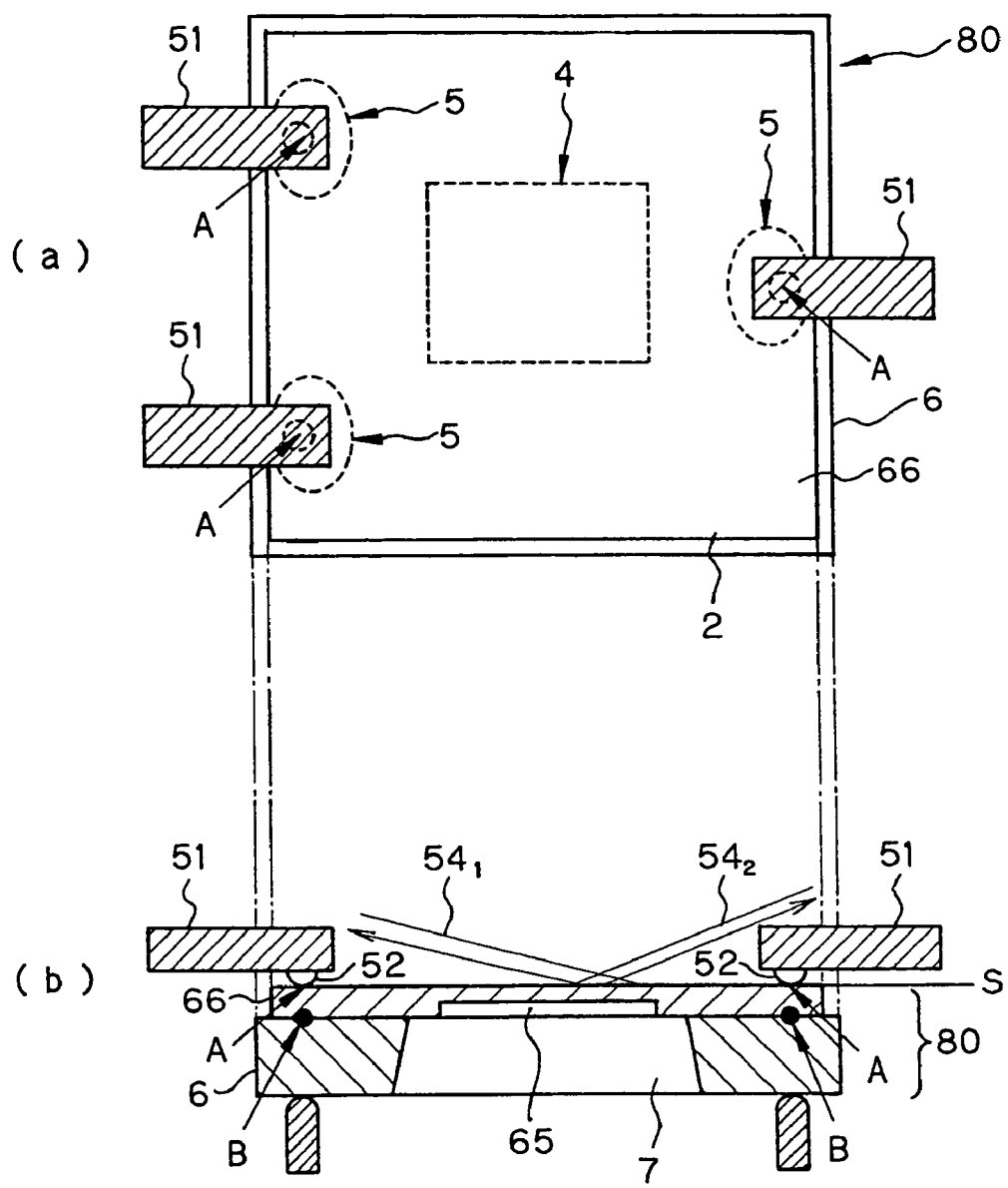
FIGS. 4(*a*) and 4(*b*) are a plan view (a) and a sectional view (b) schematically showing a mask blank for the lithography mask shown in FIGS. 2(*a*) and 2(*b*) and a preparation arrangement for writing onto the mask blank.
Figure 6:
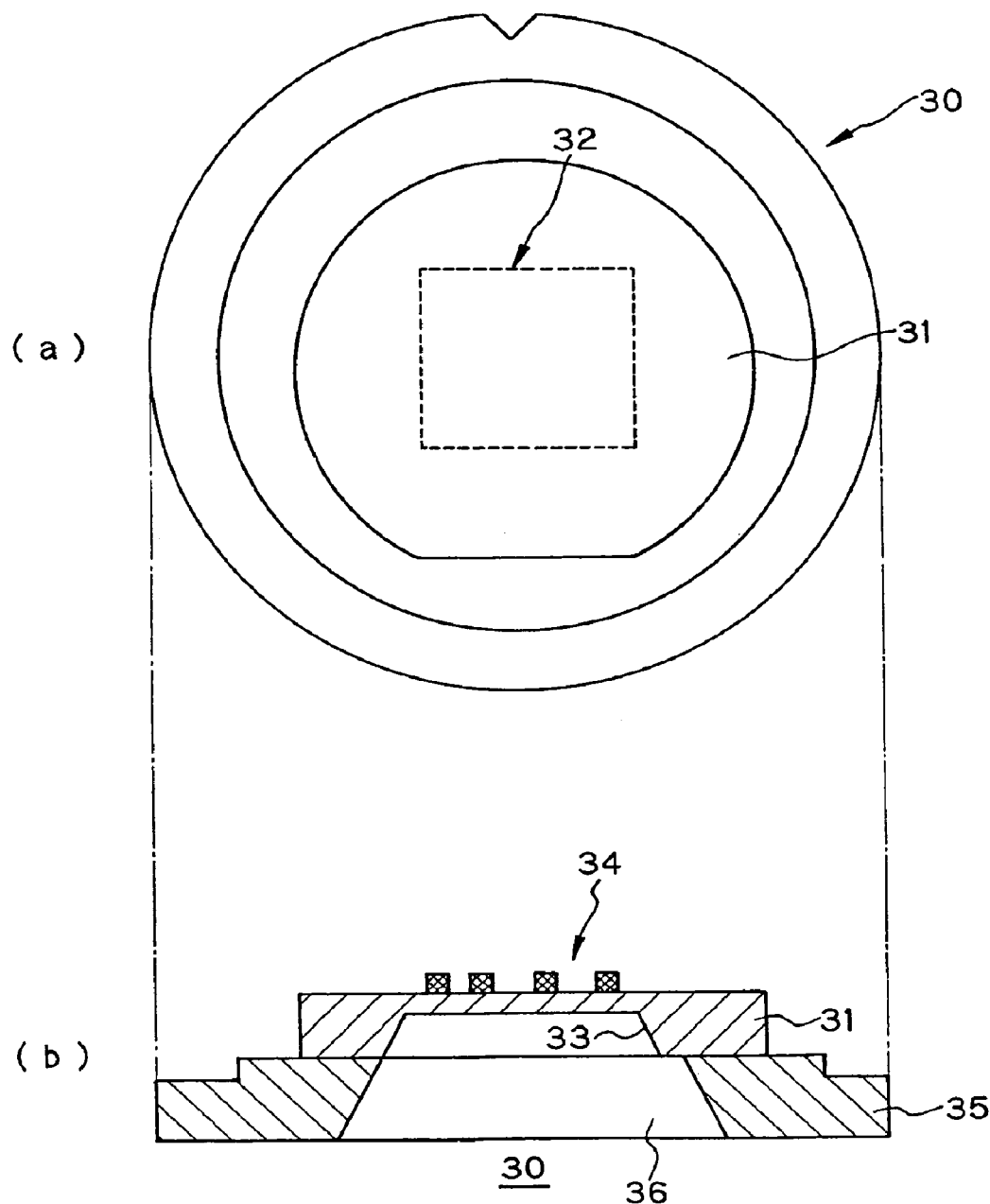
FIGS. 6(*a*) and 6(*b*) are a plan view (a) and a sectional view (b) of a lithography mask of a conventional example 2.
Figure 7:
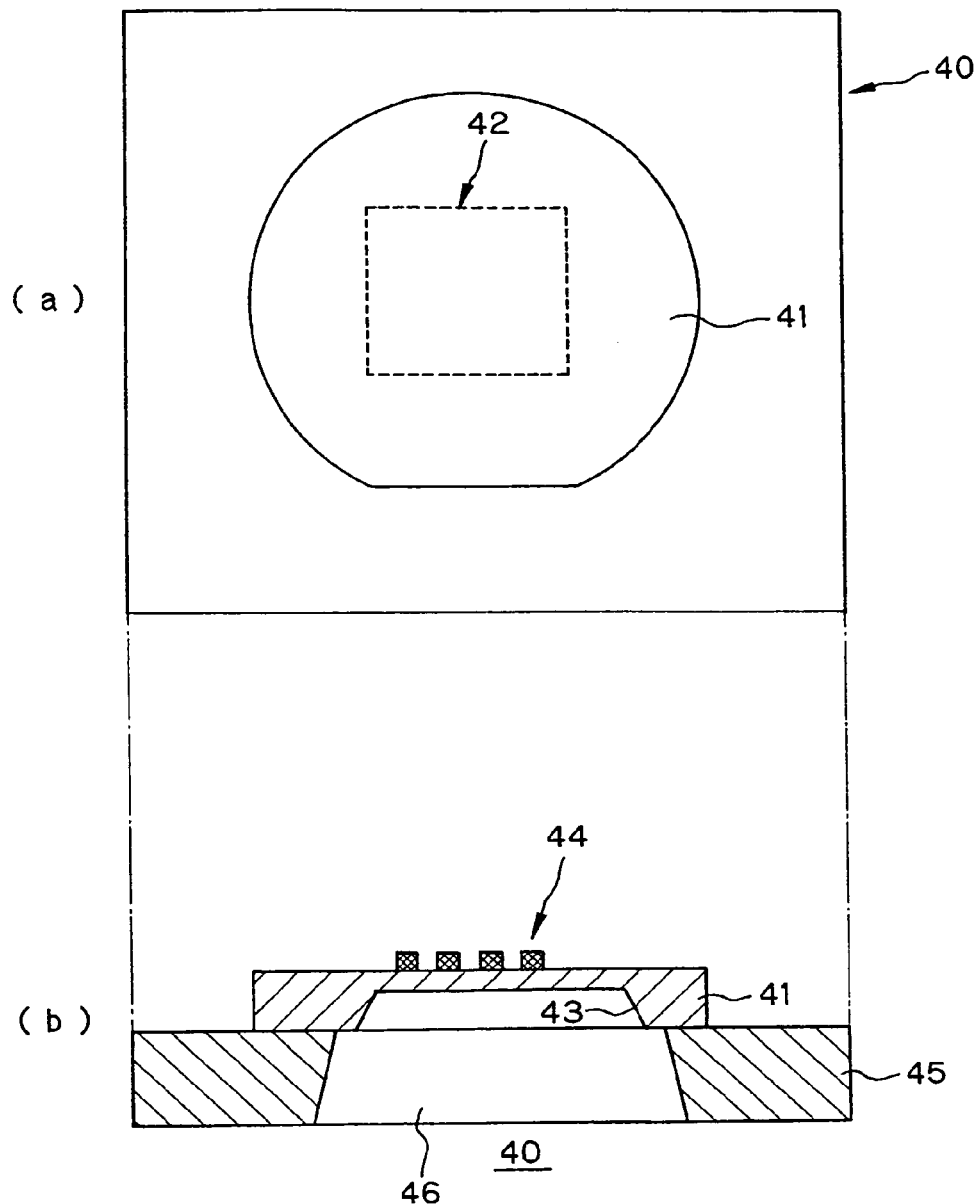
FIGS. 7(*a*) and 7(*b*) are a plan view (a) and a sectional view (b) of a lithography mask of a conventional example 3.

A blank for the stencil-type lithography mask 70 is prepared by fixing a frame 6 provided with an opening 7 to the back surface of a blank half 66 (corresponding to the lithography mask blank 66 of the embodiment of FIGS. 1(a), 1(b)) which is made by a manufacturing process similar to the process shown in FIGS. 3(a)-3(d). The blank is shown in FIGS. 4(a), 4(b) with a numeral FIGS. 4(a) and 4(b) are a plan view (a) and a sectional view (b) schematically showing a preparation arrangement for writing onto the blank 80. The blank 80 comprises a substrate 2 which is provided with an opening 3 at the center thereof and with a self-support membrane for a pattern region 4 on the front surface side, and a frame 6 which is provided with an opening 7 corresponding to the opening 3, wherein the substrate 2 is integrally fixed to the frame 6. The upper surface of the mask blank 80 is coated with a resist, but not shown.

Before the mask blank 80 is installed to an electron beam writer for photomasks, the pattern region 4 and the peripheral region 5 are in one plane. Here, the peripheral region 5 means a region including three reference points A defined by tips of hemispheroids 52 fixed on the lower surfaces of end portions of three fixing arms 51 inside the writing chamber of the electron beam writer for photomasks.

In a writing step corresponding to FIG. 3(e), the blank 80 fixed on the table in the writing chamber is positioned as shown in FIGS. 4(a), 4(b). The surface of the pattern region 4 is positioned at a level lower than a reference surface S by the deflection due to the own weight which can be estimated theoretically.

The blank half 66 and the frame 6 of the mask blank 80 are fixed to each other at positions B (positions corresponding to the three reference points A in a direction perpendicular to the surface). As the fixing positions B of the blank half (substrate) 66 with the frame 6 are brought to correspond to the reference points for the blank of a fixing mechanism of the writer or a cassette as mentioned above, the force (moment) required for moving the substrate 2 relative to the frame 6 when fixing the blank must be minimum, thereby preventing deterioration of pattern positional accuracy due to the positions of fixing the substrate 2 to the frame 6.

When the mask blank 80 for manufacturing the stencil-type lithography mask 70 as shown in FIGS. 2(a), 2(b) is installed to the electron beam writer for photomasks for writing a pattern, as also described in the above reference to FIGS. 3(e)-3(f), the electron beams for writing are accurately focused on the resist layer in the pattern region 4 over a window (consisting of the window 65 and the opening 7) of the blank 66 and thus land on the accurate position, thereby enabling the writing of an accurate and fine pattern.

In the present invention, the peripheral region is defined as a region including a substrate portion tangent to the reference points of the fixing mechanism in the writing chamber of the writer. Actually, the reference points of the fixing mechanism are located from 3 to 6 points apart from the periphery of the substrate by from 5 to 10 mm. Therefore, the peripheral region does not always include the entire periphery and may consist of from 3 to 6 areas isolated like islands. Since the preferable blank is not a blank of which orientation is predetermined and can be used even if the blank is turned clockwise by 90 degrees, 180 degrees, or 270 degrees, it is practically preferable to assign the peripheral areas distributed equally to the vicinity of the four sides on the front surface of the blank.

In the lithography mask blank in which the pattern region at the center and the peripheral region of the upper surface of the substrate are in one plane, portion other than the pattern region and the peripheral region may be depressed, for example, like a ditch. The proximity mask is required to bring only the pattern region in proximity to a wafer during transfer while other portions than the pattern region is preferably apart from the wafer because it provides the advantage of reducing the risk of contact of the mask with the wafer during the loading and unloading of the wafer. The depth of the ditch is about 10 μm or more. However, a deep ditch has a disadvantage in that it is impossible to employ the resist coating method, that is, the spin-coating method which is conventionally used for the photomask manufacturing. When a substrate having such a ditch is coated with resist by the spin-coating method, the thickness of the resist layer on the central portion (including the pattern region) must differ from that on the peripheral region and the resist layer in the vicinity of the steps of the bottom of the ditch must be thick. These problems can be solved by another coating method (for example, according to the resist coating method disclosed in Patent document 2, resist is sprayed in the form of a liquid mist from a nozzle while the substrate or the nozzle is moved, thereby applying the resist onto the entire surface of the substrate.). However, in this case, it is required to use a coating apparatus for exclusive use.

After processed into the lithography mask, the peripheral region may be ground to be depressed from the pattern region.

It is required to conform the mask shape to the SEMI standard. However, in the case of a combination of a substrate and a frame, the substrate may not have a shape conformed to the SEMI standard; for example, the substrate may have a shape without corners or of a smaller size.

The present invention can be adopted not only to a proximity lithography mask for X-ray, extreme ultraviolet beam, or the charged-particle beams but also to an electron beam lithography mask for PREVAIL. If a small pattern region is enough, 6-inch SEMI standard can be employed. If not, 7-inch or 9-inch photomask SEMI standard is preferably employed. Since electron beam writer for photomasks capable of writing on a 7-inch or 9-inch blank is now already available for use, the photomask technique can be adopted.

Though the lithography mask blank, the lithography mask, and the lithography using the lithography mask of the present invention have been described with reference to the embodiments in the above, the present invention is not limited by the embodiments and various modifications can be made.

INDUSTRIAL APPLICABILITY

As apparent from the above description, according to the present invention, the shape of the substrate of a lithography mask blank is a substantially rectangular parallelepiped and a pattern region substantially at the center and a peripheral region of the upper surface of the substrate are in one plane. Therefore, a charged-particle beam lithography mask, an X-ray lithography mask or extreme ultraviolet beam lithography mask can be manufactured by using, for example, an existing electron beam writer for photomasks. In this manner, a lithography mask having an accurate and fine mask pattern can be manufactured. Therefore, the accurate and fine mask pattern can be easily transferred from the lithography mask.

What is claimed:

1. A lithography mask blank comprising a substrate, having a shape of a substantially rectangular parallelepiped, of which the upper surface has a pattern region substantially at the center thereof and a peripheral region, wherein the pattern region and the peripheral region are in one plane, wherein the lithography mask blank consists of said substrate and a frame having a shape of substantially rectangular parallelepiped, which are fixed to each other.

2. A lithography mask blank comprising a substrate, having a shape of a substantially rectangular parallelepiped, which has a lower surface provided substantially at the center thereof with an opening and a self-supporting membrane having a pattern region substantially at the center of the upper surface thereof corresponding to said opening, wherein the pattern region and a peripheral region around the pattern region are in one plane, wherein the lithography mask blank consists of said substrate and a frame having a shape of substantially rectangular parallelepiped, which are fixed to each other.

3. A lithography mask blank as claimed in claim 1 or 2, wherein the entire lithography mask blank is integrally formed.

4. A lithography mask blank as claimed in claim 3, wherein the lithography mask blank is a blank for a charged-particle beam lithography mask.

5. A lithography mask blank as claimed in claim 3, wherein the lithography mask blank is a blank for an X-ray lithography mask or an extreme ultraviolet beam lithography mask.

6. A lithography mask blank as claimed in claim 1 or 2, wherein the fixing positions of said substrate with said frame substantially correspond to the reference points of a mechanism for fixing the transfer blank in a pattern writer or a cassette for housing the lithography mask blank.

7. A lithography mask blank as claimed in claim 6, wherein the lithography mask blank is a blank for a charged-particle beam lithography mask.

8. A lithography mask blank as claimed in claim 6, wherein the lithography mask blank is a blank for an X-ray lithography mask or an extreme ultraviolet beam lithography mask.

9. A lithography mask blank as claimed in claim 1 or 2, wherein the lithography mask blank is a blank for a charged-particle beam lithography mask.

10. A lithography mask blank as claimed in claim 1 or 2, wherein the lithography mask blank is a blank for an X-ray lithography mask or an extreme ultraviolet beam lithography mask.

11. A lithography mask comprising a substrate, having a shape of a substantially rectangular parallelepiped, which has a lower surface provided substantially at the center thereof with the opening and a self-supporting membrane having a pattern region substantially at the center of an upper surface thereof corresponding to said opening, wherein said self-supporting membrane is provided with through-holes of a mask pattern in it or an absorber or scatterer of a mask pattern on it, and the pattern region and a peripheral region around the pattern region are in one plane, wherein the lithography mask consists of said substrate and a frame having a shape of a substantially rectangular parallelepiped, which are fixed to each other.

12. A lithography mask as claimed in claim 11, wherein the entire lithography mask is integrally formed.

13. A lithography mask as claimed in claim 11 or 12, wherein the lithography mask is used as a charged-particle beam lithography mask.

14. A lithography mask as claimed in claim 11 or 12, wherein the lithography mask is used as an X-ray lithography mask or an extreme ultraviolet beam lithography mask.

15. A lithography wherein a mask pattern is transferred by using a charged-particle beam, X-ray, or extreme ultraviolet beam with a lithography mask comprising a substrate, having a shape of a substantially rectangular parallelepiped, which has a lower surface provided substantially at the center thereof with an opening and a self-supporting membrane having a pattern region substantially at the center of an upper surface thereof corresponding to said opening, wherein said self-supporting membrane is provided with through-holes of said mask pattern in it or an absorber or scatterer of said mask pattern on it, and the pattern region and a peripheral region around the pattern region are in one plane, wherein the lithography mask consists of said substrate and a frame having a shape of a substantially rectangular parallelepiped, which are fixed to each other.

* * * * *